(12) United States Patent
Wang

(10) Patent No.: US 11,581,342 B2
(45) Date of Patent: Feb. 14, 2023

(54) ARRAY SUBSTRATE, MANUFACTURING METHOD THEREOF, AND DISPLAY APPARATUS

(71) Applicant: BOE TECHNOLOGY GROUP CO., LTD., Beijing (CN)

(72) Inventor: Guoqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 670 days.

(21) Appl. No.: 16/485,286

(22) PCT Filed: Jan. 7, 2019

(86) PCT No.: PCT/CN2019/070611
§ 371 (c)(1),
(2) Date: Aug. 12, 2019

(87) PCT Pub. No.: WO2020/042521
PCT Pub. Date: Mar. 5, 2020

(65) Prior Publication Data
US 2021/0408087 A1    Dec. 30, 2021

(30) Foreign Application Priority Data

Aug. 31, 2018  (CN) .......................... 201811015597.1

(51) Int. Cl.
*H01L 27/144*  (2006.01)
*H01L 27/12*  (2006.01)
(52) U.S. Cl.
CPC ........ *H01L 27/1443* (2013.01); *H01L 27/127* (2013.01); *H01L 27/1222* (2013.01)

(58) Field of Classification Search
CPC ... H02L 21/82; H02L 21/77; H02L 27/14683; H02L 27/14643; H02L 27/127;
(Continued)

(56) References Cited

U.S. PATENT DOCUMENTS 9,997,636 B2    6/2018  Chen et al.
10,056,414 B2 *  8/2018  Zhang ................. H01L 27/1214
(Continued)

FOREIGN PATENT DOCUMENTS

CN    105789226 A    7/2016
JP    2005039289 A    2/2005

OTHER PUBLICATIONS

International Search Report in Application No. PCT/CN2019/070611, dated May 29, 2019.
(Continued)

*Primary Examiner* — John R Lee
(74) *Attorney, Agent, or Firm* — Syncoda LLC; Feng Ma

(57) ABSTRACT

An array substrate includes a substrate, a protection layer, and a photodiode. The protection layer is disposed over the substrate, has a single layer-structure, and is provided with a through-hole therein. The photodiode includes a lower electrode, a PN junction and an upper electrode, which are sequentially over the substrate. The PN junction is within the through-hole. The protection layer and the PN junction of the photodiode have a substantially same thickness. The array substrate further includes a thin-film transistor over the substrate. An orthographic projection of an active layer of the thin-film transistor on the substrate does not overlap with an orthographic projection of the PN junction of the photodiode on the substrate.

20 Claims, 7 Drawing Sheets

(58) Field of Classification Search
CPC .............. H02L 27/1259; H02L 27/124; H02L 27/1214; H02L 27/12; H02L 27/1222; H02L 27/1443
See application file for complete search history.

(56)  References Cited

U.S. PATENT DOCUMENTS

| | | | | |
|---|---|---|---|---|
| 2018/0122841 | A1* | 5/2018 | Lin | H01L 31/0224 |
| 2018/0149900 | A1* | 5/2018 | Ge | H01L 21/77 |
| 2018/0151591 | A1* | 5/2018 | Liu | H01L 27/1288 |
| 2018/0166478 | A1* | 6/2018 | Nakano | H01L 27/14663 |
| 2021/0408087 | A1* | 12/2021 | Wang | H01L 27/1222 |

OTHER PUBLICATIONS

CN First Office Action in Application No. 201811015597.1, dated Mar. 12, 2020.

* cited by examiner

ARRAY SUBSTRATE, MANUFACTURING METHOD THEREOF, AND DISPLAY APPARATUS

CROSS-REFERENCE TO RELATED APPLICATION

The present application claims priority to Chinese Patent Application No. CN 201811015597.1 filed on Aug. 31, 2018, the disclosure of which is hereby incorporated by reference in its entirety.

TECHNICAL FIELD

The present disclosure relates generally to the field of display technologies, and more specifically to an array substrate, its manufacturing method, and a display apparatus having the array substrate.

BACKGROUND

According to a typical etching process to thereby manufacture a PIN photodiode in an array substrate of a display apparatus, the etching gas can cause some damage to the side wall of PIN photodiode, which thus increases the hidden current of the PIN photodiode and reduces the signal-to-noise ratio.

At the same time, in order to reduce the hidden current, a first transparent electrode needs to be etched twice. Although the second etching of the first transparent electrode can reduce the hidden current, the effective area of PIN photodiode also unfavorably decreases accordingly.

SUMMARY

In a first aspect, the present disclosure provides an array substrate.

The array substrate includes a substrate, a protection layer, and a photodiode. The protection layer is disposed over the substrate, has a single layer-structure, and is provided with a through-hole therein. The photodiode includes a lower electrode, a PN junction and an upper electrode, which are sequentially over the substrate. It is configured such that the PN junction is within the through-hole.

Herein, the protection layer and the PN junction of the photodiode can have a substantially same thickness.

The array substrate can further include a thin-film transistor over the substrate. The thin-film transistor comprises an active layer, a gate electrode, a source electrode and a drain electrode. An orthographic projection of the active layer of the thin-film transistor on the substrate does not overlap with an orthographic projection of the PN junction of the photodiode on the substrate.

Optionally, at least one of the source electrode or the drain electrode of the thin-film transistor can be at a substantially same layer as the lower electrode of the photodiode.

Furthermore, the source electrode or the drain electrode of the thin-film transistor can be integrated with the lower electrode of the photodiode.

The array substrate can further include a barrier layer over the thin-film transistor. An orthographic projection of the barrier layer on the substrate covers an orthographic projection of a channel portion of the active layer of the thin-film transistor on the substrate.

Optionally, the barrier layer can be at a substantially same layer as at least one of the source electrode or the drain electrode of the thin-film transistor.

According to some embodiments of the array substrate, the thin-film transistor is of a bottom-gate type, and the barrier layer is over, and is electrically connected with, the gate electrode of the thin-film transistor.

According to some other embodiments of the array substrate, the thin-film transistor is of a top-gate type.

The array substrate can further include a light-shielding layer between the substrate and the active layer of the thin-film transistor. An orthographic projection of the active layer on the substrate is contained within an orthographic projection of the light-shielding layer on the substrate.

Herein, the light-shielding layer can be physically connected to at least one of the source electrode or the drain electrode of the thin-film transistor, or alternatively, can be physically connected to the gate electrode of the thin-film transistor.

In the array substrate, the upper electrode can include a first transparent electrode, and the array substrate further comprises a planarization layer over the first transparent electrode and the protection layer, and a second transparent electrode over the planarization layer. The second transparent electrode is electrically connected with the first transparent electrode through at least third via in the planarization layer.

In a second aspect, the present disclosure further provides a method for manufacturing an array substrate.

The method comprises the following steps:
providing a substrate; and
forming a protection layer and a photodiode over the substrate.

It is configured such that the protection layer has a single layer-structure and is provided with a through-hole, the photodiode comprises a lower electrode and a PN junction and an upper electrode sequentially over the substrate, wherein the PN junction is within the through-hole.

Between the step of providing a substrate and the step of forming a protection layer and a photodiode over the substrate, the method can further include a step of:
forming a thin-film transistor over the substrate, wherein the thin-film transistor comprises an active layer, a gate electrode, a source electrode and a drain electrode, and an orthographic projection of the active layer on the substrate does not overlap with an orthographic projection of the PN junction on the substrate.

Optionally, the step of forming a thin-film transistor over the substrate comprises:
forming the source electrode, the drain electrode, and the lower electrode, wherein the source electrode or the drain electrode is integrated with the lower electrode.

Optionally, the step of forming a thin-film transistor over the substrate comprises:
forming the source electrode, the drain electrode, and a barrier layer over the active layer, wherein the barrier layer is at a substantially same layer as at least one of the source electrode or the drain electrode, and an orthographic projection of the barrier layer on the substrate covers an orthographic projection of a channel portion of the active layer of the thin-film transistor on the substrate.

Furthermore, the sub-step of forming the source electrode, the drain electrode, and a barrier layer over the active layer can be performed by a one-time patterning process, which comprises:
forming a first metal material layer over the active layer; and
performing an etching on the first metal material layer to thereby form the source electrode, the drain electrode, and the barrier layer.

Optionally, the step of forming a protection layer and a photodiode over the substrate comprises:

forming a protection layer having the through-hole;

forming a photodiode material layer within the through-hole; and forming the upper electrode over the photodiode material layer, such that an orthographic projection of the upper electrode on the substrate covers an orthographic projection of the through-hole on the substrate.

In the above method, in the sub-step of forming a photodiode material layer within the through-hole, the photodiode material layer is configured to have a transition zone having a slope around the through-hole. As such, the step of forming upper transparent electrode over the photodiode material layer comprises:

forming a first transparent electrode layer over the photodiode material layer, such that the first transparent electrode layer covering the slope; and applying a photoresist layer on the first transparent electrode layer within an area corresponding to the through-hole; and performing a first etching process on the first transparent electrode layer, such that a remained portion of the first transparent electrode layer covers part of the transition zone.

In the method, the sub-step of forming upper transparent electrode over the photodiode material layer can further comprise:

performing a second etching process on the photodiode material layer to retain a portion of the photodiode material layer in the through-hole and to obtain the first transparent electrode.

Optionally, the method further comprises:

forming a planarization layer over the protection layer and the photodiode, wherein the planarization layer has at least one via connecting the upper electrode; and forming a second transparent electrode over the planarization layer, such that the second transparent electrode is electrically connected with the upper electrode through the at least one via.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1:
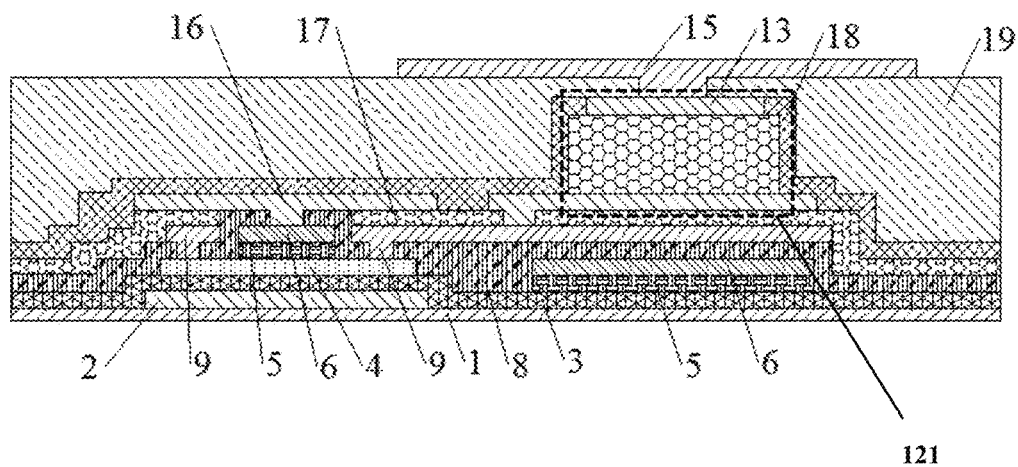
FIG. 1 is a schematic diagram of a structure of an array substrate according to an existing technology.

FIG. 1 is a schematic diagram of a structure of an array substrate according to an existing technology. With reference to FIG. 1, in the manufacturing process of the array substrate, after a source and drain electrode 9 is processed by etching, a first protection layer 17 is formed over the source and drain electrode 9 by deposition and etching. A second source and drain electrode 16 is then formed over the first protection layer 17 by deposition and etching.

Subsequently, a PIN photodiode 121 is formed over the second source and drain electrode 16 by deposition and etching. During the etching process of the PIN photodiode 121, the etching gas could cause damage to a side wall of the PIN photodiode 121, in turn causing an increased hidden current and a reduced the signal-to-noise ratio in the PIN photodiode 121.

After the formation of the PIN photodiode 121, in order to prevent the influence of elements in a passivation layer 19 that is subsequently formed on the PIN photodiode 121, the side wall of the PIN photodiode 121 needs to be protected. As such, a layer of SiO or SiON is deposited on the PIN photodiode 121 as a second protection layer 18.

In the existing array substrate shown in FIG. 1, the following issues are observed. First, due to the presence of the relatively high step of the PIN photodiode 121, as illustrated in FIG. 1, a break of connection is easily caused by the non-ideal connection between the second protection layer 18 and the side wall of the photodiode 121.

Second, in order to reduce the above hidden current caused by the damaged side wall of the PIN photodiode 121 during the etching process, a first transparent electrode 13 that is arranged over the PIN photodiode 121 needs to be etched twice. Although two times of etching on the first transparent electrode can reduce the hidden current, the effective area of the PIN photodiode decreases accordingly.

In view of the above issues, the following technical solution is provided in this present disclosure. In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, the present disclosure provides a method for manufacturing an array substrate (i.e. an array substrate manufacturing method hereafter).

Figure 2:
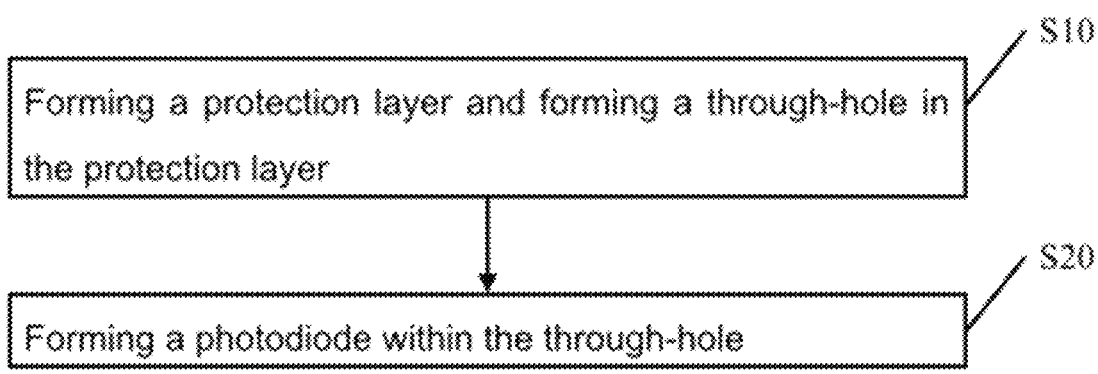
FIG. 2 illustrates a flow chart of a method for manufacturing an array substrate according to some embodiments of the disclosure.

FIG. 2 illustrates a flow chart of an array substrate manufacturing method according to some embodiments of the disclosure. As shown in FIG. 2, the array substrate manufacturing method comprises the following steps:

S10: Forming a protection layer 11 and forming a through-hole 111 in the protection layer 11; and S20: Forming a photodiode 121 within the through-hole 111.

Herein, more specifically, in the step S20, a PN junction of the photodiode is formed within the through-hole.

A detailed description of the array substrate manufacturing method shown in FIG. 2 according to some embodiments of the disclosure is provided below. The array substrate manufacturing method specifically includes the following steps S001-S014:

S001: Providing a substrate 1;

S002: Forming a light-shielding layer 2 over a substrate 1;

S003: Forming a buffer layer 3 over both the light-shielding layer 2 and the substrate 1;

S004: Forming an active layer 4 over the buffer layer 3, such that an orthographic projection thereof on the substrate 1 is overlapped with an orthographic projection of the light-shielding layer 2 on the substrate 1;

S005: Forming a gate insulating layer 5 over the active layer 4;

S006: Forming a gate electrode 6 and a first electrode layer 7 over the gate insulating layer 5;

S007: Forming an inter-layer dielectric layer 8 over the buffer layer 3, the active layer 4, the gate electrode 6, and the first electrode layer 7, wherein the inter-layer dielectric layer 8 is provided with at least one first via 81 and at least one second via 82, configured to respectively connect the active layer 4 and the gate electrode 6;

S008: Forming a source and drain electrode 9 and a barrier layer 10 over the inter-layer dielectric layer 8, such that the source and drain electrode 9 is electrically connected with the active layer 4 via the at least one first via 81, and the barrier layer 10 is electrically connected with the active layer 4 via the at least one second via 82;

S009: Forming a protection layer 11 over the source and drain electrode 9, the barrier layer 10, and the inter-layer dielectric layer 8, wherein the protection layer 11 is provided with a through-hole 111 at a position above the first electrode layer 7;

S010: Forming a photodiode material layer 12 within the through-hole 111 of the protection layer 11;

S011: Forming a first transparent electrode 13 over the photodiode material layer 12 by deposition and etching;

S012: Etching the photodiode material layer 12;

S013: Forming a planarization layer 14 over the first transparent electrode 13, the photodiode 121, and the protection layer 11, wherein the planarization layer 14 is provided with at least one third via 141 connecting the first transparent electrode 13;

S014: Forming a second transparent electrode 15 over the planarization layer 14, such that the second transparent electrode 15 is electrically connected with the first transparent electrode 13 through the at least one third via 141.

Figure 3:
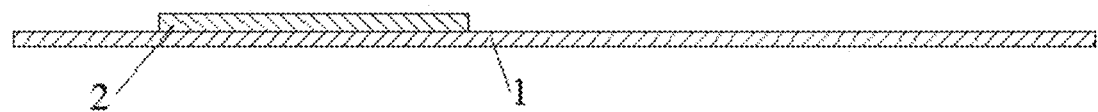
FIG. 3 illustrates a schematic structure of the array substrate after forming the light-shielding layer over the substrate.

FIG. 3 illustrates a schematic structure of the array substrate after the formation of the light-shielding layer 2 over the substrate 1 (i.e. in step S001). Herein the substrate 1 can be a glass substrate, upon which the light-shielding layer 2 is formed by deposition and etching (i.e. in step S002). The light-shielding layer 2 is arranged to be positionally staggered with the photodiode 121 to be formed in the subsequent step (i.e. an orthographic projection of the light-shielding layer 2 on the substrate 1 is not overlapped with an orthographic projection of the photodiode 121 on the substrate 1), and is configured to shield the active layer 4 in the thin-film transistor to be formed from lights.

Figure 4:
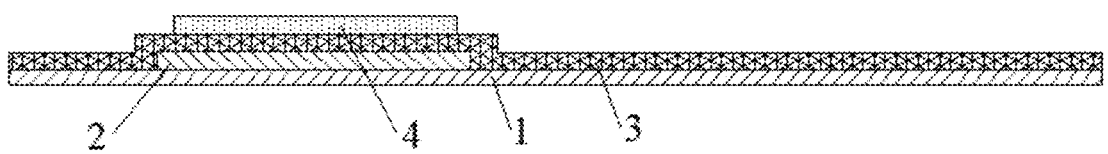
FIG. 4 illustrates a schematic structure of the array substrate after forming the buffer layer and the active layer on the basis of the structure illustrated in FIG. 3.

FIG. 4 illustrates a schematic structure of the array substrate after the formation of the buffer layer 3 and the active layer 4 on the basis of the structure illustrated in FIG. 3. Herein, the buffer layer 3 is first formed over both the light-shielding layer 2 and the substrate 1 (i.e. in step S003), then the active layer 4 is formed over the buffer layer 3 by deposition and etching (i.e. in step S004), and the active layer 4 is configured to be just above the light-shielding layer 2 (i.e. an orthographic projection of the active layer 4 on the substrate 1 is overlapped with an orthographic projection of the light-shielding layer 2 on the substrate 1).

Herein, the active layer 4 includes a channel portion that can be arranged between a source electrode and a drain electrode. According to some embodiments, the active layer 4 comprises an oxide as a material of the channel portion. A cut-off current for an active layer having a composition of an oxide is about two orders of magnitude smaller than that of an active layer having a composition of monocrystalline silicon or crystalline silicon (a-Si), whose order of magnitude can reach about $10^{-13}$.

Figure 5:
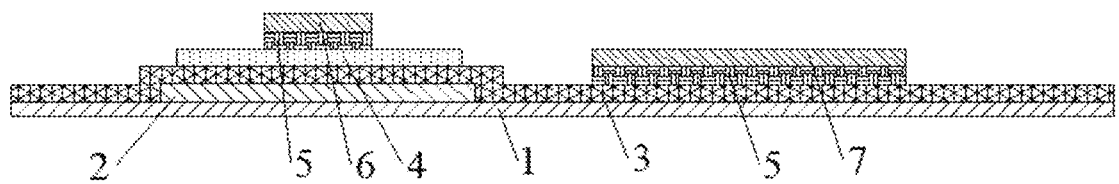
FIG. 5 illustrates a schematic structure of the array substrate after forming the gate insulating layer and the gate electrode on the basis of the structure illustrated in FIG. 4.

FIG. 5 illustrates a schematic structure of the array substrate after forming the gate insulating layer 5 and the gate electrode 6 on the basis of the structure illustrated in FIG. 4. Herein, a gate insulating layer 5 is first formed over both the active layer 4 and the buffer layer 3 by deposition and etching (i.e. in step S005). Then a second metal material layer is deposited over the gate insulating layer 5, which then undergoes etching to thereby form the gate electrode 6 and the first electrode layer 7 (i.e. in step S006).

The gate electrode 6 is arranged just above the active layer 4 (i.e. an orthographic projection of the gate electrode 6 on the substrate 1 is overlapped with an orthographic projection of the active layer 4 on the substrate 1). As illustrated in FIG. 5, the first electrode layer 7 is arranged above the buffer layer 3 (i.e. an orthographic projection of the first electrode layer 7 on the substrate 1 is overlapped with an orthographic projection of the buffer layer 3 on the substrate 1), and more specifically, is arranged substantially just below the photodiode 121 to be formed (i.e. the orthographic projection of the first electrode layer 7 on the substrate 1 is overlapped with an orthographic projection of the photodiode 121 to be formed on the substrate 1).

Figure 6:
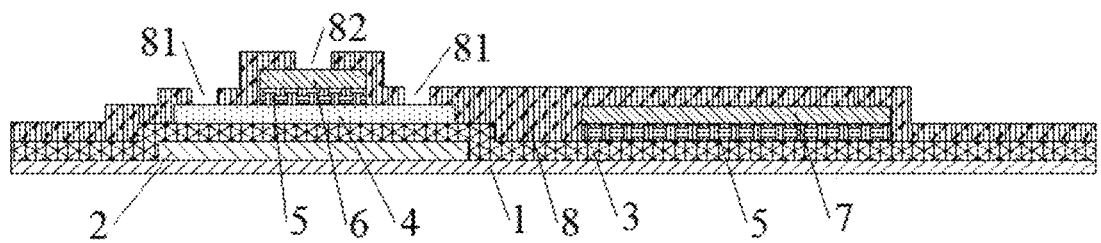
FIG. 6 illustrates a schematic structure of the array substrate after forming the inter-layer dielectric layer with at least one first via and at least one second via on the basis of the structure illustrated in FIG. 5.

FIG. 6 illustrates a schematic structure of the array substrate after forming the inter-layer dielectric layer 8 with at least one first via 81 and at least one second via 82 on the basis of the structure illustrated in FIG. 5. Herein, the formation of the inter-layer dielectric layer 8 with at least one first via 81 and at least one second via 82 arranged therein is performed by the step S007.

Specifically, an inter-layer dielectric layer 8 can be first formed over the buffer layer 3, the active layer 4, the gate electrode 6, and the first electrode layer 7, and at least one first via 81 and at least one second via 82 can then be formed in the inter-layer dielectric layer 8 such that each first via 81 connects the active layer 4, and each second via 82 connects the gate electrode 6.

Figure 7:
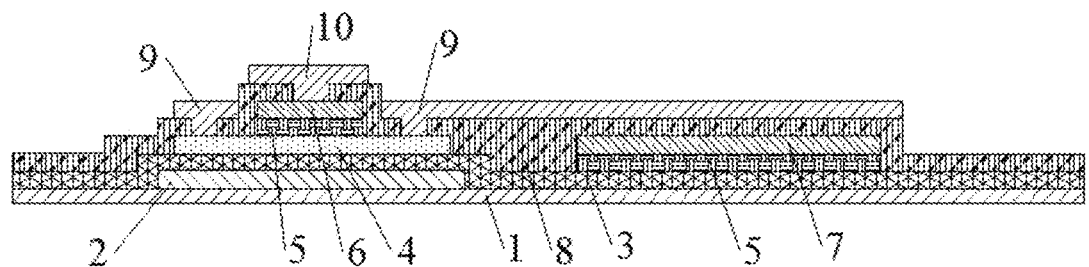
FIG. 7 illustrates a schematic structure of the array substrate after forming the source and drain electrode and the barrier layer on the basis of the structure illustrated in FIG. 6.

FIG. 7 illustrates a schematic structure of the array substrate after forming the source electrode, the drain electrode 9, and the barrier layer 10 on the basis of the structure illustrated in FIG. 6. Herein a first metal material layer can be first formed over the inter-layer dielectric layer 8, which then undergoes a patterning process by etching to thereby form the source electrode 9, the drain electrode 9, and the barrier layer 10, to thereby complete the step S008.

The source electrode 9 and the drain electrode 9 (collectively termed the source and drain electrode 9) are electrically connected with the active layer 4 via the at least one first via 81. As further shown in FIG. 7, the source and drain electrode 9 further contains an extending portion that extends to a position below the photodiode 121 to be formed so as to electrically connect with the photodiode 121 to thereby serve as a lower electrode for the photodiode 121. The extending portion of the source and drain electrode 9 can also form a capacitor along with the first electrode layer 7, and as such, it is employed as a second electrode for the capacitor. The capacitor is configured to store a signal from the photodiode 121.

The barrier layer 10 is electrically connected with the active layer 4 via the at least one second via 82. The barrier layer 10 is configured such that an orthographic projection thereof on the substrate 1 covers an orthographic projection of the channel portion of the active layer 4 of the thin-film transistor on the substrate 1.

Because a large number of hydrogen ions and hydrogen free radicals will be produced in the subsequent formation of the photodiode 121 and the protection layer 11, which, if infiltrated into the channel portion of the active layer 4, can greatly and unfavorably influence the characteristics of the thin film transistor thus formed. As such, the barrier layer 10 can play a role comparable to the second source and drain electrode 16 in the array substrate shown in FIG. 1 (i.e. based on an existing technology), and the formation of a second source and drain electrode 16 in the array substrate in FIG. 1 can thus be skipped.

Up to the step S008, the formation of the thin-film transistor is substantially completed. It is noted that the above embodiment has used a bottom-gate thin-film transistor as an example, yet this serves only as an illustrating example and does not impose a limitation to the scope of the disclosure.

According to some other embodiments, the thin-film transistor thus manufactured can also be of a top-gate type, or in other words, the source and drain electrode 9 is over a side of the gate electrode 6 that is closer to the substrate 1, and accordingly in the embodiments of the array substrate manufacturing method, the formation of the source and drain electrode 9 is prior to the formation of the gate electrode 6.

Figure 8:
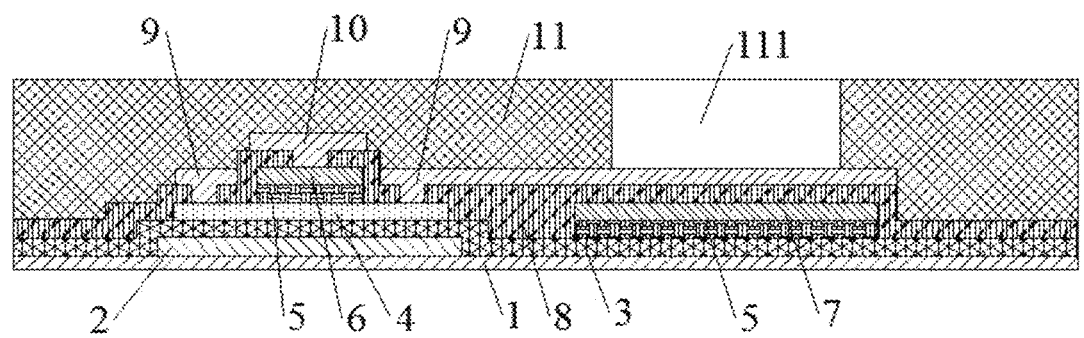
FIG. 8 illustrates a schematic structure of the array substrate after forming the protection layer on the basis of the structure illustrated in FIG. 7.

FIG. 8 illustrates a schematic structure of the array substrate after forming the protection layer 11 on the basis of the structure illustrated in FIG. 7. Herein, the step S009 is performed, and specifically, a protection layer 11 is first formed over the source and drain electrode 9, the barrier layer 10, and the inter-layer dielectric layer 8 by deposition, then a through-hole 111 is formed within the protection layer 11. The through-hole 111 is arranged just above the first electrode layer 7 (i.e. an orthographic projection of the through-hole 111 on the substrate 1 is contained within an orthographic projection of the first electrode layer 7 on the substrate 1). The protection layer 11 can have a thickness of approximately 10,000 angstroms.

Figure 9:
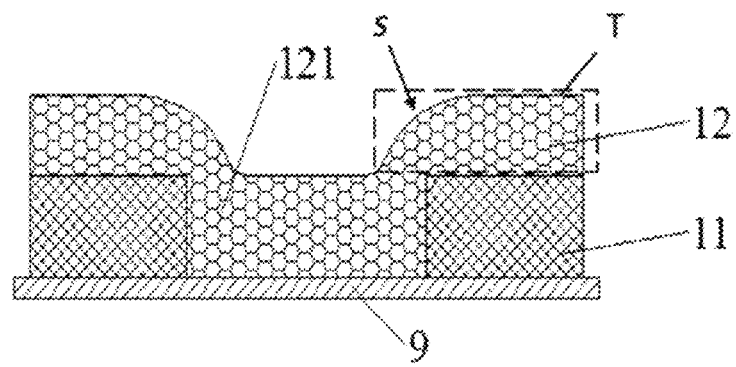
FIG. 9 illustrates a schematic diagram of a local structure of the array substrate after forming the photodiode material layer on the basis of the structure illustrated in FIG. 8.

FIG. 9 is a schematic diagram of a local structure of the array substrate after forming the photodiode material layer 12 on the basis of the structure illustrated in FIG. 8. Herein the step S010 is performed, and specifically, a photodiode material layer is first formed over the protection layer 11 by deposition, with a transition zone T having a certain slope s around the through-hole 111 (as shown in FIG. 9, with only one transition zone T shown in a box with dotted lines). The photodiode material layer 12 can have a substantially same thickness as the protection layer 11, and can also be about 10,000 angstroms. The photodiode 121 can be a PIN photodiode or a photodiode of another type capable of detecting optical signals.

Figure 10:
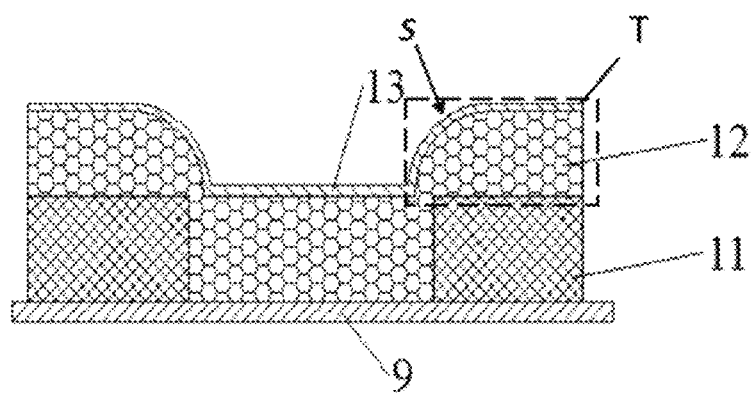
FIG. 10 illustrates a schematic structure of a local structure of the array substrate after forming the first transparent electrode layer on the basis of the structure illustrated in FIG. 9.
Figure 11:
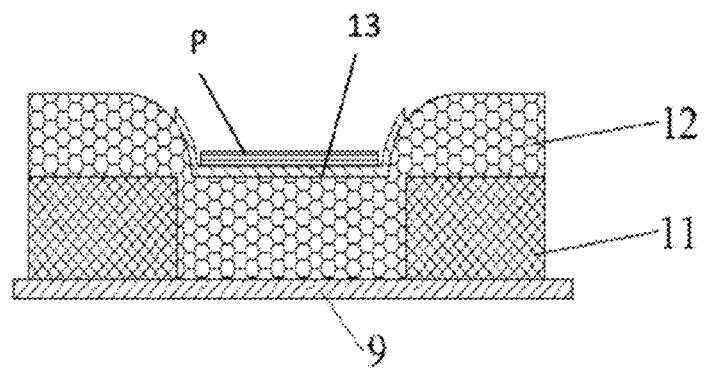
FIG. 11 illustrates a schematic structure of a local structure of the array substrate after etching the first transparent electrode layer on the basis of the structure illustrated in FIG. 10.

FIG. 10 illustrates a schematic structure of a local structure of the array substrate after forming the first transparent electrode layer 13 on the basis of the structure illustrated in FIG. 9. FIG. 11 illustrates a schematic structure of the array substrate after etching the first transparent electrode layer on the basis of the structure illustrated in FIG. 10.

Herein with reference to FIG. 10 and FIG. 11, the step S011 is substantially performed. More specifically, a first transparent electrode layer 13 is first formed over the photodiode material layer 12 by deposition, as shown in FIG. 10. Because the first transparent electrode layer 13 has a relatively small thickness, it can climb over the transition zone T along the slope s thereby form a climbing zone. Then a photoresist layer P (not shown in FIG. 10, but shown in FIG. 11) can be formed on the first transparent electrode layer 13 in an area directly opposite to the through-hole 111 (as shown in FIG. 11), then a first etching process can be performed over the first transparent electrode layer 13, such that after the first etching process, the remaining first transparent electrode layer covers part of the transition zone T, as illustrated in FIG. 11, where the photoresist layer P is also shown. Herein it is noted that the first etching process is substantially a first sub-step of the step S012.

Figure 12:
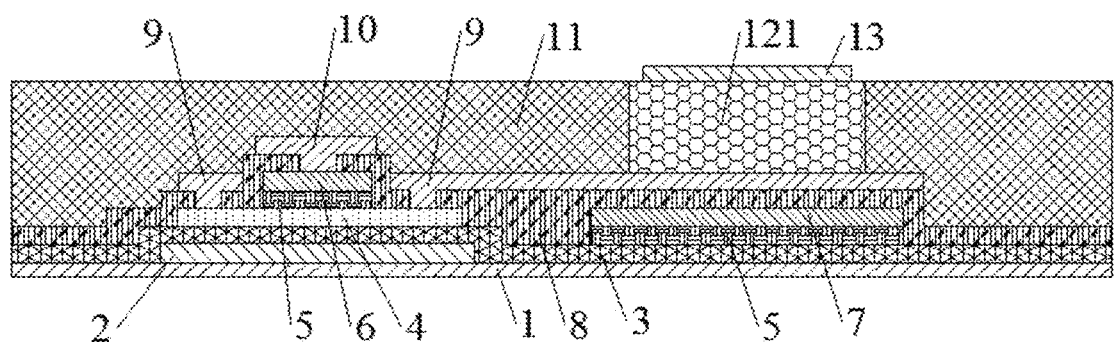
FIG. 12 illustrates a schematic structure of the array substrate after etching the photodiode material layer on the basis of the structure illustrated in FIG. 11.

FIG. 12 illustrates a schematic structure of the array substrate after etching the photodiode material layer 12 on the basis of the structure illustrated in FIG. 11. Herein, substantially a second etching process is performed, which is part of the step S012. Specifically, after the first etching process, the portion of the photoresist layer P above the first transparent electrode layer 13 still exists, as shown in FIG. 11. Then under the influence of the etching gas, the photoresist layer P retracts faster, so the first transparent electrode layer 13 on both sides can be exposed, and the first transparent electrodes thus exposed will be etched by the physical bombardment of the etching plasma.

The etching effect is that the transition zone T thus remained is small or even totally etched off, so that an orthographic projection of the first transparent electrode 13 on the substrate 1 falls within an orthographic projection of the photodiode 121 on the substrate 1. That is, the area of the first transparent electrode 13 is smaller than that of the photodiode 121.

This above process can avoid a second etching process of the first transparent electrode layer 13 in a traditional array substrate manufacturing process illustrated in FIG. 1. As such, at least one patterning process can be skipped, and an effective area of the photodiode 121 can be increased.

Figure 13:
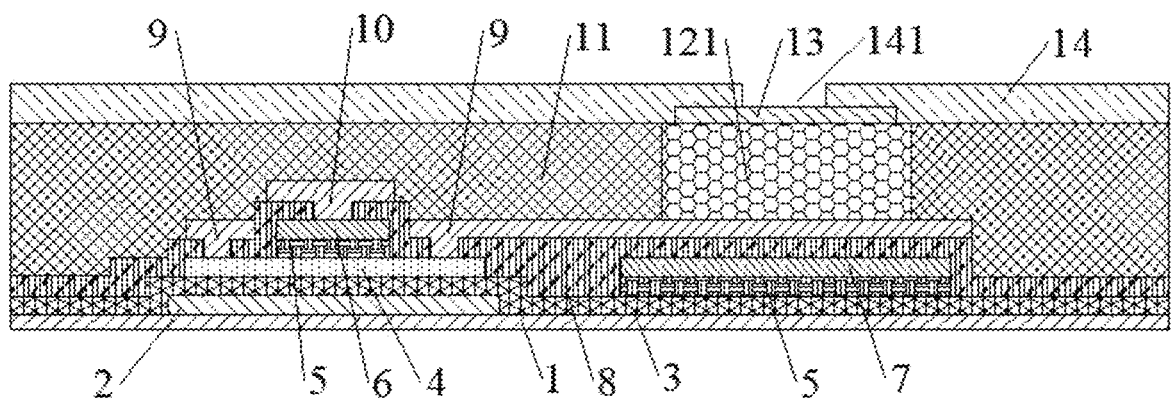
FIG. 13 illustrates a schematic structure of the array substrate after forming the planarization layer on the basis of the structure illustrated in FIG. 12.

FIG. 13 illustrates a schematic structure of the array substrate after forming the planarization layer 14 on the basis of the structure illustrated in FIG. 12. Herein, the step S013 is performed. Specifically, a planarization layer 14 is first formed over the first transparent electrode 13, the photodiode 121, and the protection layer 11 by deposition, then the planarization layer 14 undergoes an etching process to thereby form at least one third via 141 therewithin, which is configured to connect the first transparent electrode 13.

Figure 14A:
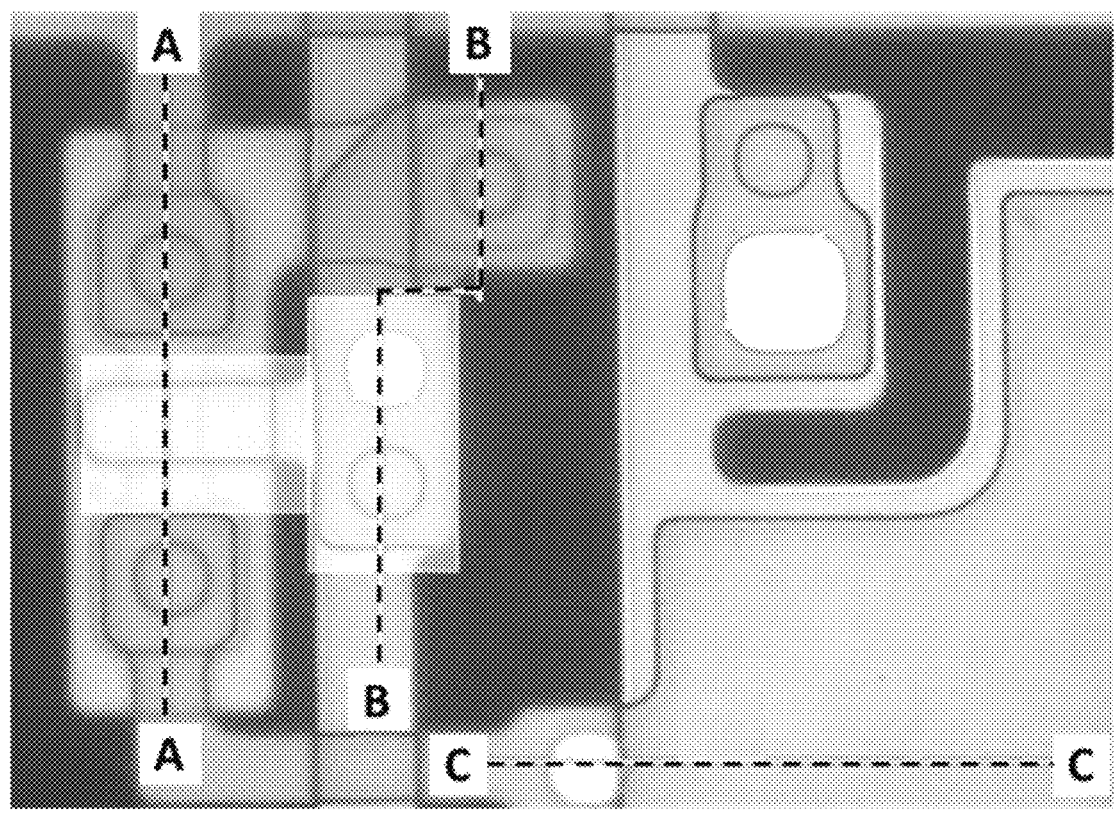
FIG. 14A illustrates a top view of an array substrate according to some embodiments of the disclosure.
Figure 14B:
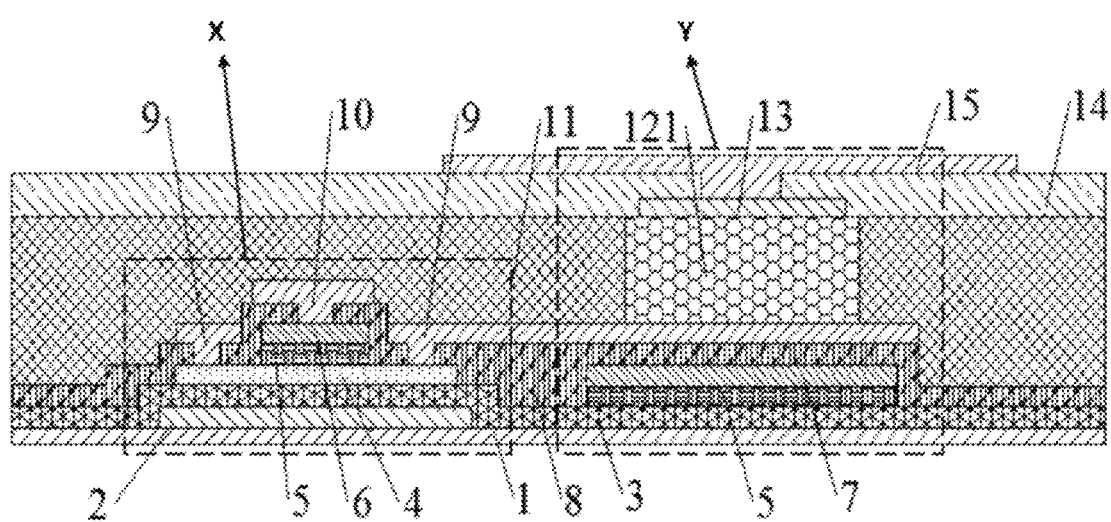
FIG. 14B illustrates a cross-sectional view of the schematic structure of the array substrate shown in FIG. 14A.

After forming the second transparent electrode 15 on the basis of the structure illustrated in FIG. 13, the schematic structure of the array substrate formed thereby is illustrated in FIG. 14B. Herein, the schematic structure of the array substrate shown in FIG. 14B is substantially a cross-sectional view of an array substrate according to some embodiments of the present disclosure. A top view of the array substrate is illustrated in FIG. 14A.

It is noted that the boxed region in X in FIG. 14B is substantially a cross-sectional view along the lines AA and BB in FIG. 14A, and that the boxed region in Y in FIG. 14B is substantially a cross-sectional view along the line CC.

Herein, the step S014 is performed. Specifically, a second transparent electrode layer is first formed over the planarization layer 14 by deposition, and then an etching process is performed over the second transparent electrode layer to thereby form the second transparent electrode 15. The second transparent electrode 15 is electrically connected to the first transparent electrode 13 through the at least one third via 141.

In a second aspect, the present disclosure further provides an array substrate. The array substrate can be manufactured by the method described above.

The array substrate includes a protection layer 11 and a photodiode 121. The protection layer 11 is provided with a through-hole 111, and the photodiode 121 is arranged within the through-hole 111.

In the following, with further reference to FIG. 14, the structure of the array substrate is described in detail.

As shown in FIG. 4, the array substrate includes a substrate 1. A light-shielding layer 2 is over the substrate 1, and is arranged to be positionally staggered with a photodiode 121 (i.e. an orthographic projection of the light-shielding layer 2 on the substrate 1 is not overlapped with an orthographic projection of the photodiode 121 on the substrate 1), and the light-shielding layer 2 is configured to shield the thin-film transistor from lights.

A buffer layer 3 is arranged over both the light-shielding layer 2 and the substrate 1. An active layer 4 is over the buffer layer 3 and is arranged right above the light-shielding layer 2 (i.e. an orthographic projection of the active layer 4 on the substrate 1 is contained within an orthographic projection of the light-shielding layer 2 on the substrate 1).

A gate insulating layer 5 is arranged over both the active layer 4 and the buffer layer 3. A gate electrode 6 is arranged over the gate insulating layer 5 and at a position right above the active layer 4 (i.e. an orthographic projection of the gate electrode 6 on the substrate 1 is contained within an orthographic projection of the active layer 4 on the substrate 1).

A first electrode layer 7 is arranged over the gate insulating layer 5 and at a position above the buffer layer 3 and below the photodiode 121 (i.e. an orthographic projection of the first electrode layer 7 on the substrate 1 covers an orthographic projection of the photodiode 121 on the substrate 1).

Herein the gate electrode 6 and the first electrode layer 7 can, according to some embodiments, be manufactured by a common patterning process as described above in the embodiment of the method in the first aspect of the disclosure so that the manufacturing process can be simplified. It is noted that the gate electrode 6 and the first electrode layer 7 can optionally be manufactured by different processes.

An inter-layer dielectric layer 8 is arranged over the buffer layer 3, the active layer 4, the gate electrode 6, and the first electrode layer 7, and the inter-layer dielectric layer 8 is provided with at least one first via 81 and at least one second via 82, which are respectively configured to connect the active layer 4 and the gate electrode 6 respectively.

A source and drain electrode 9 and a barrier layer 10 are arranged over the inter-layer dielectric layer 8, which can be formed through a common patterning process as described above in the embodiment of the method in the first aspect of the disclosure.

The source and drain electrode 9 is electrically connected with the active layer 4 via the at least one first via 81, and it further extends to a position below the photodiode 121 so as to electrically connect with the photodiode 121. The source and drain electrode 9 further forms a capacitor along with the first electrode layer 7, and the capacitor is configured to store a signal from the photodiode 121.

The barrier layer 10 is arranged right above the gate electrode 6 (i.e. an orthographic projection of the barrier layer 10 on the substrate 1 overlaps with an orthographic projection of the gate electrode 6 on the substrate 1), and is electrically connected with the active layer 4 through the at least one second via 82.

It is noted that in the above, the structure of the array substrate is described with a bottom-gate thin-film transistor as an illustrating example, and the array substrate can optionally adopt a top-gate thin-film transistor as well.

A protection layer 11 is further arranged over the source and drain electrode 9, the barrier layer 10, and the inter-layer dielectric layer 8, and the protection layer 11 is provided with a through-hole 111, which is arranged at a position above the first electrode layer 7 (i.e. an orthographic projection of the through-hole 111 on the substrate 1 is contained within an orthographic projection of the first electrode layer 7 on the substrate 1). The protection layer 11 can have a substantially same thickness as the photodiode 121, which can be approximately 10,000 angstroms.

Herein the protection layer 11 also plays a role of providing planarization, thus avoiding that the first transparent electrode 13 is electrically connected to the side wall of the photodiode 121. In addition, it can also prevent the break caused by the non-ideal connection between the second protection layer 18 and the side wall of the photodiode due to the presence of the high step of the photodiode in FIG. 1.

A first transparent electrode 13 is arranged over the PIN photodiode 121, which is configured such that an orthographic projection thereof on the substrate 1 is contained within an orthographic projection of the photodiode 121 on the substrate 1. A planarization layer 14 is arranged over the first transparent electrode 13, the photodiode 121, and the protection layer 11, and the planarization layer 14 is provided with at least one third via 141. A second transparent electrode 15 is arranged over the planarization layer 14, and the second transparent electrode 15 is electrically connected to the first transparent electrode 13 through the at least one third via 141.

Figure 15:
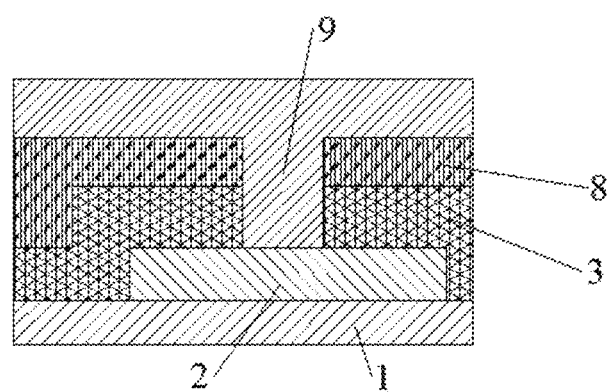
FIG. 15 is a cross-sectional view of a local structure of an array substrate according to some other embodiments of the disclosure.

FIG. 15 is illustrates a partial structure of an array substrate according to some other embodiments of the disclosure, which is substantially a cross-sectional view of the array substrate shown in FIG. 14A along the line AA and BB. As illustrated, at least one fourth via is arranged to run through both the buffer layer 3 and the inter-layer dielectric layer 8, and the source and drain electrode 9 is connected to the light-shielding layer 2 through the at least one fourth via. The light-shielding layer 2 has a metal composition, and thus is easy to float. In order to avoid the floating of the light-shielding layer 2, the light-shielding layer 2 can be connected to the source and drain electrode 9 through the at least one fourth via shown in FIG. 15. It is noted that the light-shielding layer 2 can also be connected to the gate electrode 6 through at least one fifth via (not shown in the drawings) to realize a similar purpose.

In a third aspect, the present disclosure further provides a display apparatus, which includes the array substrate according to any one of the embodiments as described above.

Throughout the disclosure, the terms "about", "around", "approximately", and alike, usually mean that a parameter of interest is within 20%, preferably 10%, and more preferably 5%, of a given value or range.

Throughout the disclosure, the terms "over"/above" or "below" are mainly relative terms, which are used to describe a relative positional relationship of one component relative to another component, and shall be referenced to the figures in the drawings. Understandably, if the illustrated structure is flipped upside down, the component described as "above" will become the component described as "below".

In addition, these above terms could mean that one component (i.e. a first component) is formed "directly" on another component (i.e. a second component), or that it is "indirectly" on the another component (i.e. the second component) through yet another component (i.e. a third component).

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
a substrate;
a photodiode comprising a lower electrode, a PN junction, and an upper electrode, disposed sequentially over the substrate; and
a protection layer configured to protect the photodiode; wherein:
the protection layer is a single-layer structure configured to provide planarization and has a through-hole therein; and
the PN junction is within the through-hole.

2. The array substrate of claim 1, wherein the protection layer and the PN junction of the photodiode have a substantially same thickness.

3. The array substrate of claim 1, further comprising a thin-film transistor over the substrate, wherein the thin-film transistor comprises an active layer, a gate electrode, a source electrode and a drain electrode, wherein:
an orthographic projection of the active layer of the thin-film transistor on the substrate does not overlap with an orthographic projection of the PN junction of the photodiode on the substrate.

4. The array substrate of claim 3, wherein at least one of the source electrode or the drain electrode of the thin-film transistor is at a substantially same layer as the lower electrode of the photodiode.

5. The array substrate of claim 4, wherein the source electrode or the drain electrode of the thin-film transistor is integrated with the lower electrode of the photodiode.

6. The array substrate of claim 3, further comprising a barrier layer over the thin-film transistor, wherein:
an orthographic projection of the barrier layer on the substrate covers an orthographic projection of a channel portion of the active layer of the thin-film transistor on the substrate.

7. The array substrate of claim 6, wherein the barrier layer is at a substantially same layer as at least one of the source electrode or the drain electrode of the thin-film transistor.

8. The array substrate of claim 7, wherein the thin-film transistor is of a bottom-gate type, and the barrier layer is over, and is electrically connected with, the gate electrode of the thin-film transistor.

9. The array substrate of claim 3, further comprising a light-shielding layer between the substrate and the active layer of the thin-film transistor, wherein an orthographic projection of the active layer on the substrate is contained within an orthographic projection of the light-shielding layer on the substrate.

10. The array substrate of claim 9, wherein the light-shielding layer is physically connected to at least one of the source electrode or the drain electrode of the thin-film transistor.

11. The array substrate of claim 9, wherein the light-shielding layer is physically connected to the gate electrode of the thin-film transistor.

12. The array substrate of claim 1, wherein the upper electrode comprises a first transparent electrode, and the array substrate further comprises:
a planarization layer over the first transparent electrode and the protection layer; and
a second transparent electrode over the planarization layer, wherein the second transparent electrode is electrically connected with the first transparent electrode through at least third via in the planarization layer,
wherein the protection layer is configured to avoid the first transparent electrode electrically connected to a side wall of the photodiode.

13. A method for manufacturing an array substrate, comprising:
providing a substrate; and
forming a photodiode over the substrate, and a protection layer configured to protect the photodiode,
wherein the protection layer is a single-layer structure configured to provide planarization and has a through-hole therein, wherein the photodiode comprises a lower electrode and a PN junction and an upper electrode sequentially over the substrate, and wherein the PN junction is within the through-hole.

14. The method of claim 13, further comprising, between the providing a substrate and the forming a protection layer and a photodiode over the substrate:
forming a thin-film transistor over the substrate, wherein the thin-film transistor comprises an active layer, a gate electrode, a source electrode and a drain electrode, and an orthographic projection of the active layer on the substrate does not overlap with an orthographic projection of the PN junction on the substrate.

15. The method of claim 14, wherein the forming a thin-film transistor over the substrate comprises:
forming the source electrode, the drain electrode, and the lower electrode, wherein the source electrode or the drain electrode is integrated with the lower electrode.

16. The method of claim 14, wherein the forming a thin-film transistor over the substrate comprises:
forming the source electrode, the drain electrode, and a barrier layer over the active layer, wherein the barrier layer is at a substantially same layer as at least one of the source electrode or the drain electrode, and an orthographic projection of the barrier layer on the substrate covers an orthographic projection of a channel portion of the active layer of the thin-film transistor on the substrate.

17. The method of claim 16, wherein the forming the source electrode, the drain electrode, and a barrier layer over the active layer is performed by a one-time patterning process, comprising:
forming a first metal material layer over the active layer; and
performing an etching on the first metal material layer to thereby form the source electrode, the drain electrode, and the barrier layer.

18. The method of claim 14, wherein the forming a protection layer and a photodiode over the substrate comprises:
forming a protection layer having the through-hole;
forming a photodiode material layer within the through-hole; and
forming the upper electrode over the photodiode material layer, such that an orthographic projection of the upper electrode on the substrate covers an orthographic projection of the through-hole on the substrate.

19. The method of claim 18, wherein:
in the forming a photodiode material layer within the through-hole, the photodiode material layer has a transition zone having a slope around the through-hole; and
the forming upper transparent electrode over the photodiode material layer comprises:
forming a first transparent electrode layer over the photodiode material layer, such that the first transparent electrode layer covering the slope; and
applying a photoresist layer on the first transparent electrode layer within an area corresponding to the through-hole; and
performing a first etching process on the first transparent electrode layer, such that a remained portion of the first transparent electrode layer covers part of the transition zone.

20. The method of claim 19, wherein the forming upper transparent electrode over the photodiode material layer further comprises:
performing a second etching process on the photodiode material layer to retain a portion of the photodiode material layer in the through-hole and to obtain the first transparent electrode.

* * * * *